United States Patent
Yoshida et al.

(10) Patent No.: US 8,213,179 B2
(45) Date of Patent: Jul. 3, 2012

(54) SEMICONDUCTOR ELEMENT COOLING STRUCTURE

(75) Inventors: Tadafumi Yoshida, Nisshin (JP); Hiroshi Osada, Komaki (JP); Yutaka Yokoi, Seto (JP); Yasushi Yamada, Nishikamo-gun (JP)

(73) Assignee: Toyota Jidosha Kabushiki Kaisha, Aichi-Ken (JP)

( * ) Notice: Subject to any disclaimer, the term of this patent is extended or adjusted under 35 U.S.C. 154(b) by 8 days.

(21) Appl. No.: 12/664,572

(22) PCT Filed: Jun. 10, 2008

(86) PCT No.: PCT/JP2008/060936
§ 371 (c)(1),
(2), (4) Date: Dec. 14, 2009

(87) PCT Pub. No.: WO2008/153172
PCT Pub. Date: Dec. 18, 2008

(65) Prior Publication Data
US 2010/0182747 A1    Jul. 22, 2010

(30) Foreign Application Priority Data
Jun. 15, 2007 (JP) ................. 2007-158845

(51) Int. Cl.
*H05K 7/20* (2006.01)

(52) U.S. Cl. ........ 361/699; 361/689; 361/691; 361/692; 361/698; 165/80.3; 165/80.5; 257/712; 257/714

(58) Field of Classification Search .......... 361/646, 361/688–694, 698–699, 704, 710, 715–722
See application file for complete search history.

(56) References Cited

U.S. PATENT DOCUMENTS

| | | | | |
|---|---|---|---|---|
| 4,912,600 A | * | 3/1990 | Jaeger et al. | 361/700 |
| 5,121,290 A | * | 6/1992 | Azar | 361/692 |
| 6,166,903 A | | 12/2000 | Ranchy et al. | |
| 6,588,497 B1 | * | 7/2003 | Glezer et al. | 165/84 |
| 2006/0026983 A1 | * | 2/2006 | Tilton et al. | 62/310 |
| 2006/0284308 A1 | * | 12/2006 | Harada et al. | 257/729 |
| 2008/0156462 A1 | * | 7/2008 | Arik et al. | 165/80.4 |
| 2009/0190302 A1 | * | 7/2009 | Bhattacharya et al. | 361/679.47 |
| 2009/0190308 A1 | * | 7/2009 | Bhattacharya et al. | 361/694 |

FOREIGN PATENT DOCUMENTS

DE    4108037 C2    3/1991
GB    2 253 748 A    9/1992

(Continued)

OTHER PUBLICATIONS

Japanese Office Action for corresponding Japanese Patent Application No. 2007-158845 mailed Sep. 28, 2010.

(Continued)

*Primary Examiner* — Courtney Smith
(74) *Attorney, Agent, or Firm* — Sughrue Mion, PLLC

(57) ABSTRACT

A semiconductor element cooling structure includes a plurality of semiconductor elements, and electrode structure, which has cooling medium channels therein and is electrically connected to the plurality of semiconductor elements. The electrode structure includes an alternating current electrode having the semiconductor elements on each of opposite surfaces, and a plurality of direct current electrodes holding therebetween the alternating current electrode and the semiconductor elements respectively mounted on the opposite surfaces of the alternating current electrode. Each of the alternating current electrode and the direct current electrodes has the cooling medium channels therein.

5 Claims, 5 Drawing Sheets

FOREIGN PATENT DOCUMENTS

| | | |
|---|---|---|
| JP | 61-248455 A | 11/1986 |
| JP | 2001-024125 A | 1/2001 |
| JP | 2002-343914 A | 11/2002 |
| JP | 2004-158489 A | 6/2004 |
| JP | 2005-057130 A | 3/2005 |
| JP | 2006-303290 A | 11/2006 |
| JP | 2007-215396 A | 8/2007 |

OTHER PUBLICATIONS

German Office Action dated Jun. 21, 2011 issued in a corresponding German Patent Application No. 11 2008 001 410.0.

* cited by examiner

SEMICONDUCTOR ELEMENT COOLING STRUCTURE

TECHNICAL FIELD

The present invention relates to a semiconductor element cooling structure and, more specifically, to a structure for cooling a semiconductor element mounted on an electrode having a cooling medium channel.

BACKGROUND ART

Cooling devices for cooling heat generating bodies such as semiconductor elements have been known. By way of example, Japanese Patent Laying-Open No. 2005-57130 (Patent Document 1) describes a semiconductor cooling unit having a structure in which a semiconductor element is placed between a pair of flat electrode plates, and a coolant passage is formed in the electrode plate.

Further, Japanese Patent Laying-Open No. 2004-158489 (Patent Document 2) describes a pressure contact semiconductor device including a plurality of semiconductor element stacked bodies with a plurality of stacked semiconductor elements, and a plurality of rectifier element stacked bodies with a plurality of stacked rectifier elements, held with pressure in the stacking direction.

According to Patent Document 1, a plurality of coolant passages are allotted to one semiconductor element. Therefore, the structure for cooling semiconductor element comes to have a large size. This hinders reduction in size of the semiconductor module including the semiconductor element. The cooling passage according to Patent Document 2 is not formed in an external connection terminal and, therefore, cooling mechanism becomes large, hindering reduction in size of the semiconductor device.

DISCLOSURE OF THE INVENTION

An object of the present invention is to provide a structure for cooling a semiconductor element that can attain high cooling efficiency with simple structure.

The semiconductor element cooling structure in accordance with the present invention includes a plurality of semiconductor elements, and an electrode portion having a cooling medium channel therein and electrically connected to a plurality of semiconductor elements.

By the arrangement described above, efficiency of cooling semiconductor elements can be improved with a simple structure.

In the semiconductor element cooling structure above, preferably, the electrode portion includes a first electrode having the semiconductor element mounted on each of opposite surfaces, and a plurality of second electrodes holding therebetween the first electrode and the semiconductor elements mounted on each of the opposite surfaces of the first electrode. The first electrode and the second electrode each have the cooling medium channel therein.

Therefore, cooling medium channels can be formed on both sides of the semiconductor element and, therefore, efficiency of cooling the semiconductor element can further be improved.

According to an aspect, the semiconductor element cooling structure has a structure formed by stacking a plurality of electrode portions including the first and second electrodes. According to another aspect, in the semiconductor element cooling structure, the first and second electrodes have main surfaces. The semiconductor element cooling structure has a structure formed by arranging side by side a plurality of electrode portions including the first and second electrodes, in a direction of the main surfaces.

Preferably, the semiconductor element cooling structure described above further includes a protruding portion protruded from a wall surface of the cooling medium channel to the inside of the cooling medium channel, for directing flow of cooling medium flowing through the cooling medium channel to the semiconductor element.

By the arrangement, as the protruded portion is provided to direct the flow of cooling medium to the semiconductor element, heat transfer efficiency by the cooling medium improves, and hence, efficiency of cooling semiconductor device can further be improved.

In the semiconductor element cooling structure described above, the protruded portion is provided to be positioned near the semiconductor element and upstream side than the center of the semiconductor element in the flow direction of the cooling medium.

As an example, in the semiconductor element cooling structure described above, the semiconductor element is included in a controller controlling a rotating electric machine driving a vehicle.

According to the present invention, a structure for cooling a semiconductor element that can attain high cooling efficiency with simple structure can be provided as described above.

Two or more of the structures described above may appropriately be combined.

BEST MODES FOR CARRYING OUT THE INVENTION

Figure 1:
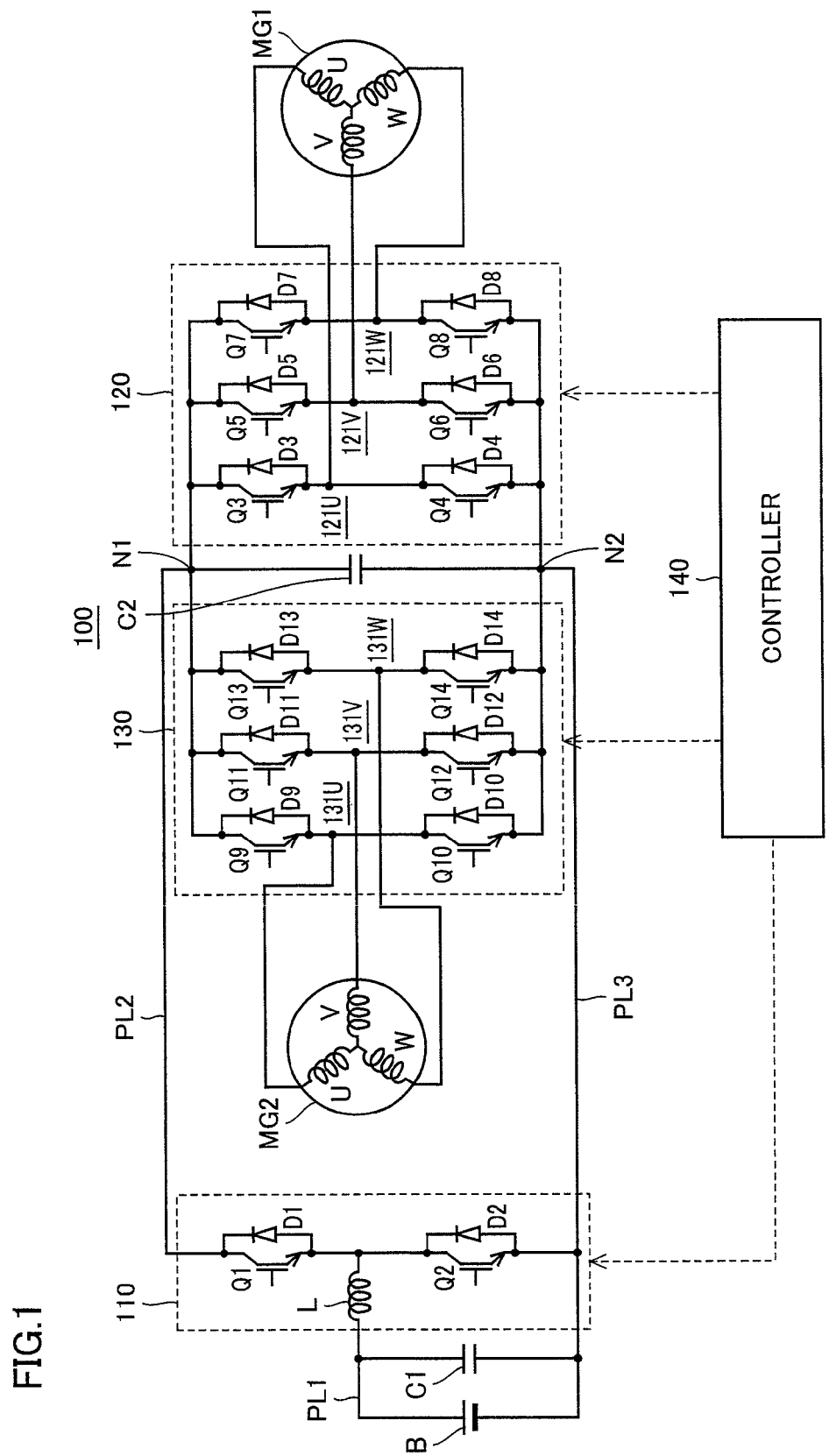
FIG. 1 is a circuit diagram showing a structure of a main portion of a PCU to which the semiconductor element cooling structure in accordance with one embodiment of the present invention is applied.

In the following, embodiments of the present invention will be described. It is noted that the same or corresponding portions are denoted by the same reference characters, and description thereof may not be repeated.

In the embodiments described in the following, descriptions of numbers, amounts and the like are not intended to limit the scope of the invention unless otherwise specified. Further, in the embodiments below, each component is not always necessary, unless otherwise specified. When a plurality of embodiments are possible, it is naturally expected that structures of various embodiments are appropriately combined, unless otherwise specified.

FIG. 1 is a circuit diagram showing a configuration of a main portion of PCU to which the semiconductor element cooling structure in accordance with an embodiment of the present invention is applied. It is noted that PCU 100 shown in FIG. 1 represents a "controller for a rotating electric machine driving a vehicle."

Referring to FIG. 1, PCU 100 includes a converter 110, inverters 120 and 130, a controller 140, and capacitors C1 and C2. Converter 110 is connected between a battery B and inverters 120 and 130, and inverters 120 and 130 are connected to motor generators MG1 and MG2, respectively.

Converter 110 includes power transistors Q1 and Q2, diodes D1 and D2, and a reactor L. Power transistors Q1 and Q2 are connected in series, and each at its base, receive a control signal from controller 140. Diodes D1 and D2 are connected between collector and emitter of power transistors Q1 and Q2, respectively, to cause current flow from emitter side to collector side of power transistors Q1 and Q2, respectively. Reactor L has one end connected to a power line PL1 connected to a positive electrode of battery B, and the other end connected to a node between power transistors Q1 and Q2.

Converter 110 boosts DC voltage received from battery B using reactor L, and supplies the boosted voltage to a power line PL2. Further, converter 110 lowers the DC voltage received from inverter 120, 130, and with this voltage, charges battery B.

Inverters 120 and 130 include U-phase arms 121U and 131U, V-phase arms 121V and 131V, and W-phase arms 121W and 131W, respectively. U-phase arm 121U, V-phase arm 121V and W-phase arm 121W are connected in parallel between nodes N1 and N2. Similarly, U-phase arm 131U, V-phase arm 131V and W-phase arm 131W are connected in parallel between nodes N1 and N2.

U-phase arm 121U includes series-connected two power transistors Q3 and Q4. Similarly, U-phase arm 131U, V-phase arms 121V and 131V and W-phase arms 121W and 131W include series-connected two power transistors Q5 to Q14, respectively. Between collector and emitter of each of the power transistors Q3 to Q14, diodes D3 to D14, causing current flow from emitter side to collector side, are connected, respectively.

A middle point of the arm of each phase in inverters 120 and 130 is connected to an end of each phase of coils of respective phases in motor generators MG1 and MG2. Motor generators MG1 and MG2 are formed by three coils of U, V and W phases, each having one end connected commonly to a mid point.

Capacitor C1 is connected between power lines PL1 and PL3, and smoothes voltage level of power line PL1. Further, capacitor C2 is connected between power lines PL2 and PL3, and smoothes voltage level of power line PL2.

Inverters 120 and 130 convert a DC voltage from capacitor C2 to an AC voltage based on a drive signal from controller 140, and thereby drive motor generators MG1 and MG2.

Controller 140 calculates coil voltages of respective phases of motor generators MG1 and MG2, based on a motor torque command value, phase current values of motor generators MG1 and MG2, and input voltages of inverters 120 and 130, and based on the result of calculation, generates and outputs to inverters 120 and 130 a PWM (Pulse Width Modulation) signal for turning on/off power transistors Q3 to Q14.

Further, controller 140 calculates duty ratio of power transistors Q1 and Q2 for optimizing input voltages to inverters 120 and 130 based on the motor torque command value and motor rotation number mentioned above, and based on the result of calculation, generates and outputs to converter 110 a PWM signal for turning on/off power transistors Q1 and Q2.

Further, controller 140 controls switching operations of power transistors Q1 to Q4 of converter 110 and inverters 120 and 130, in order to convert the AC power generated by motor generators MG1 and MG2 to DC power and thereby to charge battery B.

When PCU 100 operates, power transistors Q1 to Q 14 and diodes D1 to D14 forming converter 110 and inverters 120 and 130 generate heat. Therefore, it is necessary to provide a cooling mechanism for promoting cooling of these semiconductor elements.

Figure 2:
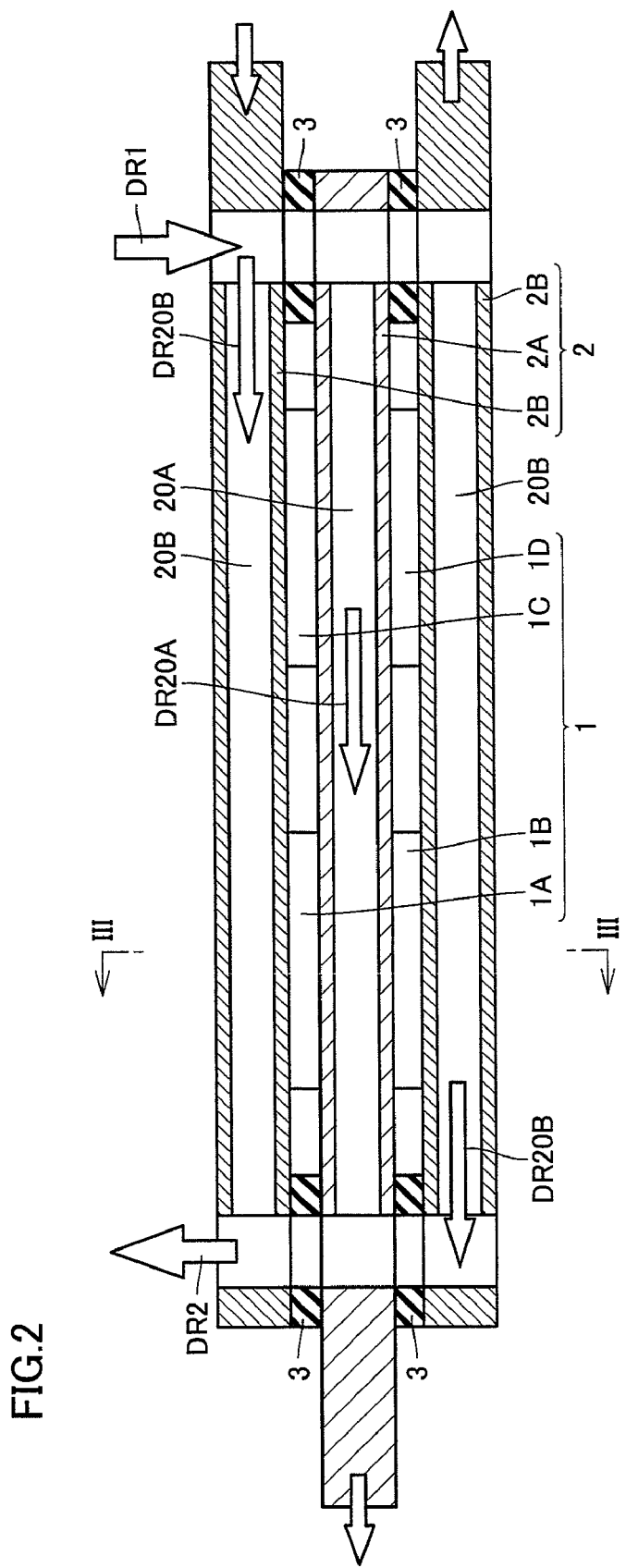
FIG. 2 is a cross-sectional view showing the semiconductor element cooling structure in accordance with one embodiment of the present invention.
Figure 3:
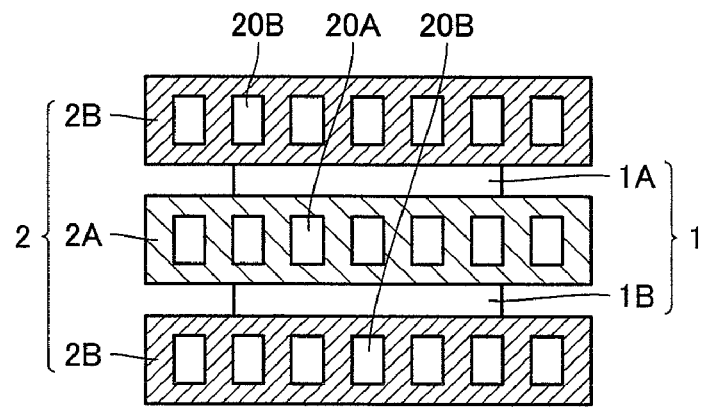
FIG. 3 is a cross-sectional view taken along the line III-III of FIG. 2.

FIG. 2 is a cross-sectional view showing the semiconductor element cooling structure in accordance with one embodiment of the present invention. FIG. 3 is a cross-sectional view taken along the line III-III of FIG. 2. Referring to FIGS. 2 and 3, the semiconductor element cooling structure in accordance with the present embodiment is formed including a plurality of semiconductor elements (1A to 1D) and an electrode structure 2.

Semiconductor element 1 is, for example, power transistors Q3 to Q14 and diodes D3 to D14. In the example of FIG. 2, a plurality of semiconductor elements 1A to 1D are shown as semiconductor element 1. Electrode structure 2 is formed including an AC electrode 2A and a DC electrode 2B. Semiconductor element 1 (1A to 1D) is placed between AC electrode 2A and DC electrode 2B. In AC electrode 2A and DC electrode 2B, cooling medium channels 20A and 20B are formed. Cooling medium for cooling semiconductor element 1 flows into electrode structure 2 from the direction of an arrow DR1, flows in the direction of arrows DR20A, 20B in cooling medium channels 20A and 20B, and flows out in the direction of an arrow DR2. By the cooling medium flowing through cooling medium channels 20A and 20B in this manner, semiconductor elements 1 A to 1D are cooled It is noted that wall surfaces of cooing medium channels 20A and 20B are insulated by forming, for example, an oxide film and a nitride film.

AC electrode 2A and DC electrode 2B are formed, for example, of metal having relatively high heat transfer coefficient such as copper. Between AC electrode 2A and DC electrode 2B, an insulator 3 is interposed, to ensure electrical insulation between AC electrode 2A and DC electrode 2B.

AC electrode 2A is formed by combining two plate-shaped members. The two plate-shaped members each have a protruded portion protruding to the other member and to engage with each other. By combining the two plate-shaped members such that the protruded portions engage with each other, AC electrode 2A having a channel-shaped cooling medium channel 20A therein can be formed. DC electrode having cooling medium channel 20B therein can also be formed in the similar manner as AC electrode 20A.

Next, referring to FIGS. 4 and 5, an example of a three-phase inverter module (inverters 120, 130) including the semiconductor element cooling structure in accordance with the present embodiment will be described.

Figure 4:
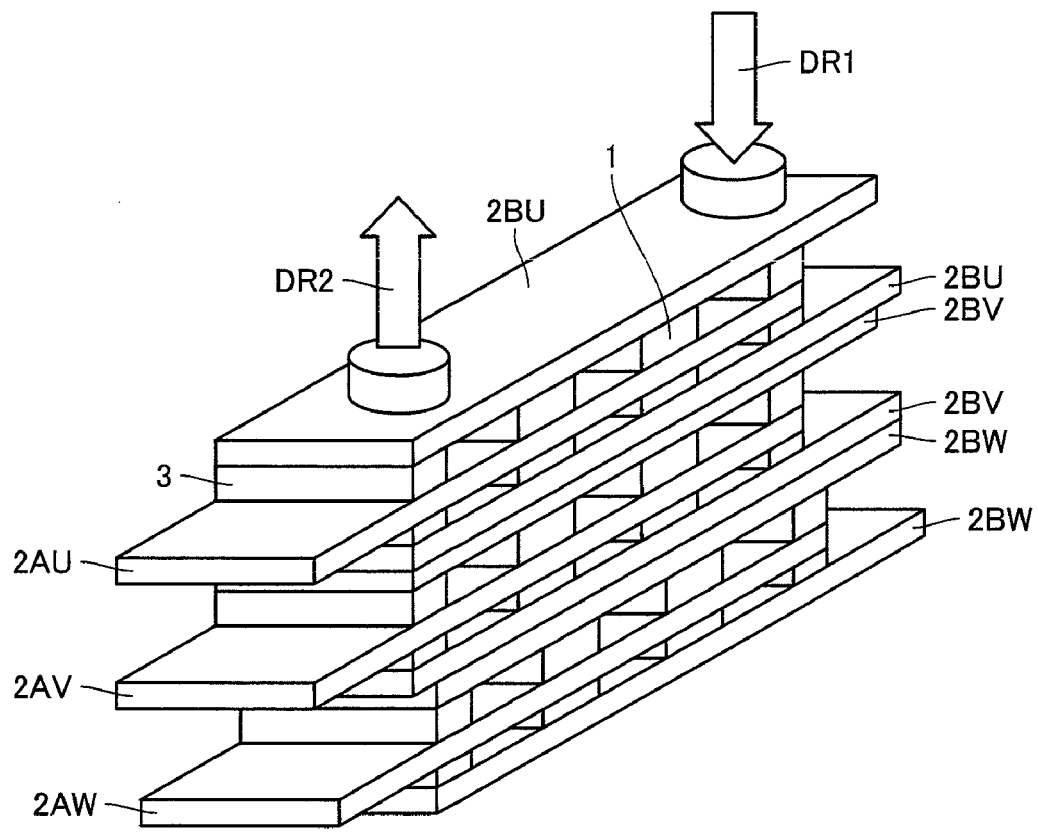
FIG. 4 is a perspective view showing a three-phase inverter module including the semiconductor element cooling structure shown in FIG. 2.

In the example shown in FIG. 4, a module structure is formed, in which an electrode structure including DC electrode 2BU and AC electrode 2AU, an electrode structure including DC electrode 2BV and AC electrode 2AV, and an electrode structure including DC electrode 2BW and AC electrode 2AW are stacked. Here, the cooling medium for cooling semiconductor element 1 flows from the direction of an arrow DR1 to the electrode structure, flows through each electrode and flows out in the direction of an arrow DR2.

Figure 5:
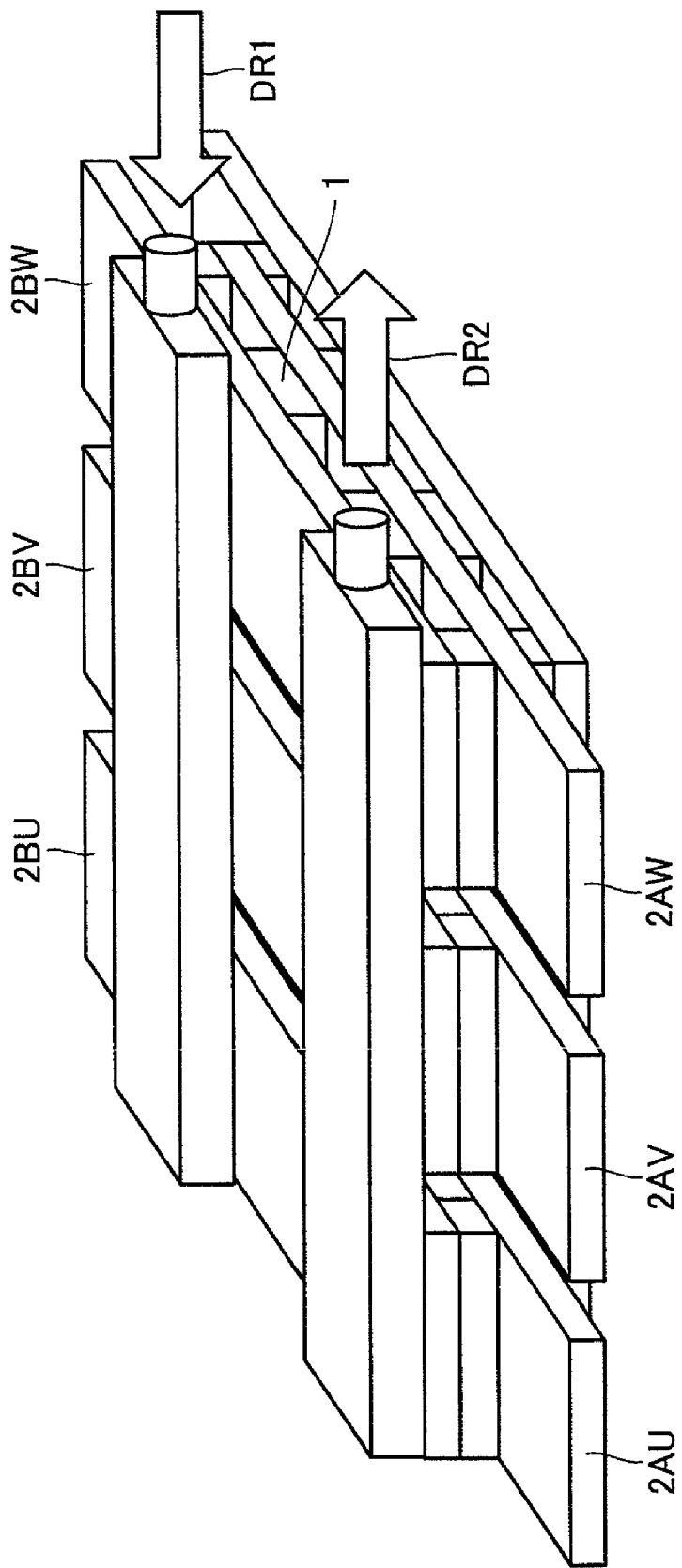
FIG. 5 is a perspective view showing an exemplary modification of three-phase inverter module including the semiconductor element cooling structure shown in FIG. 2.

In the example shown in FIG. 5, a module structure is formed, in which an electrode structure including DC electrode 2BU and AC electrode 2AU, an electrode structure including DC electrode 2BV and AC electrode 2AV, and an electrode structure including DC electrode 2BW and AC electrode 2AW are arranged side by side in the direction of main surface of each electrode. Here, the cooling medium for cooling semiconductor element 1 flows from the direction of an arrow DR1 to the electrode structure, flows through each electrode and flows out in the direction of an arrow DR2.

The three-phase inverter module included in PCU 100 of FIG. 1 may be formed by either one of the examples shown in FIGS. 4 and 5. Spaces formed in the modules shown in FIGS. 4 and 5 are filled, for example, with resin mold or resin gel.

Next, referring to FIG. 6, a modification of the semiconductor element cooling structure in accordance with the present embodiment will be described.

Figure 6:
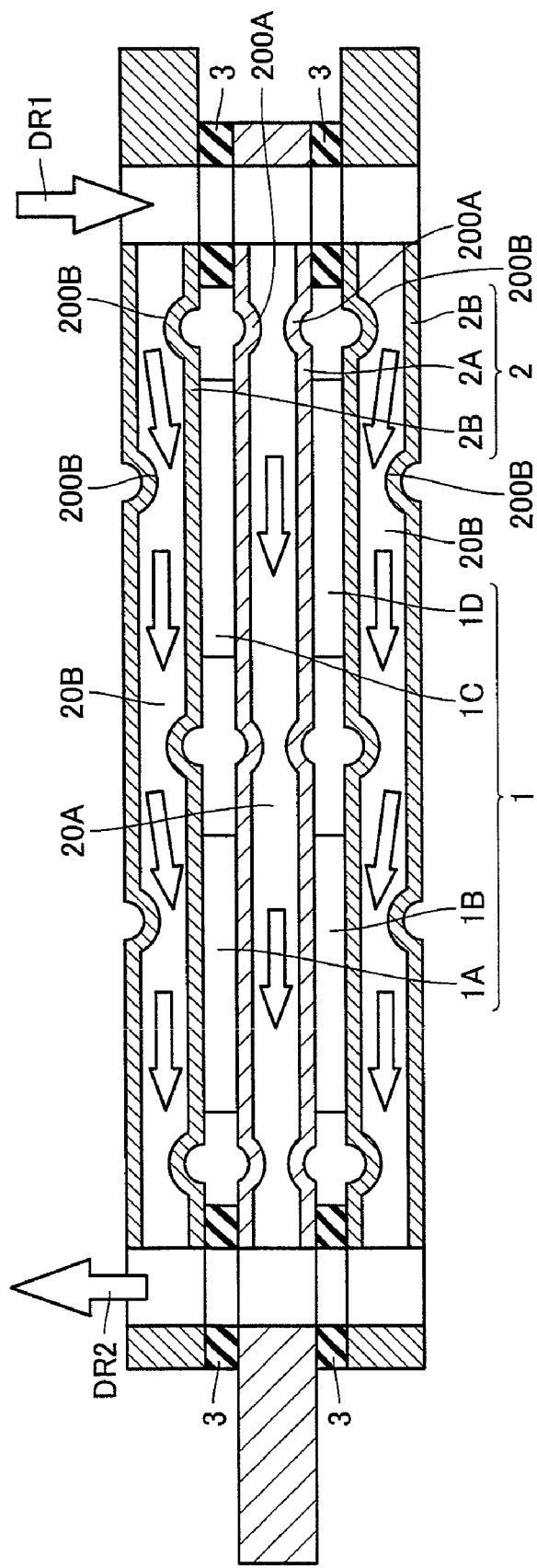
FIG. 6 is a cross-sectional view showing a modification of the semiconductor element cooling structure in accordance with one embodiment of the present invention.

Referring to FIG. 6, in the cooling structure of the present modification, AC electrode 2A and DC electrode 2B are formed, each by one flat tube. Here, AC electrode 2A has a dimple 200A formed therein, and DC electrode 2B has a dimple 200B formed therein.

There is a possibility that stress increases in the flat tubes forming AC electrode 2A and DC electrode 2B, because of heat generated by semiconductor element 1 during an operation of PCU 100. By the provision of dimples 200A and 200B in flat tubes, increase in stress can be alleviated.

Further, dimple 200B provided in DC electrode 2B is formed such that the flow of cooling medium in cooling medium channel 20B is directed to semiconductor elements 1A to 1D (more specifically, at a position near semiconductor element 1 and upstream side than the center of semiconductor element 1 in the flow direction of cooling medium). Specifically, dimple 200B protrudes from the wall surface of cooling medium channel 20B to the inside of cooling medium channel 20B, and forms a "protruded portion" that directs the flow of cooling medium flowing through cooling medium channel 20B to semiconductor element 1.

At the time of ebullient cooling, a film of air bubbles may form on the wall surface of cooling medium channel 20B positioned immediately above or immediately below the portion where semiconductor element 1 is mounted. The air bubble film may possibly be a factor decreasing efficiency of cooling semiconductor element 1. The film of air bubbles, however, can be pricked, because the flow of cooling medium in cooling medium channel 20B is directed to semiconductor element 1. Therefore, efficiency of cooling semiconductor element 1 can further be improved.

In the semiconductor element cooling structure in accordance with the present embodiment, cooling medium channels 20A and 20B are formed in AC electrode 20A and DC electrode 20B and, therefore, it is possible to cause the cooling medium to flow to portions close to semiconductor element 1. Therefore, efficiency of cooling semiconductor element 1 can be improved. Here, AC electrode 2A and DC electrode 2B are connected to a plurality of semiconductor elements 1. Therefore, when the structure described above is adopted, the device is not made larger or complicated. Further, by providing DC electrodes 2B opposite to each other, parasitic inductance can be reduced, because of mutual inductance effect.

The contents described above will be summarized in the following. The semiconductor element cooling structure in accordance with the present embodiment includes a plurality of semiconductor elements 1 (1A to 1D), and an electrode structure 2 as an "electrode portion" having cooling medium channels 20A and 20B therein and electrically connected to the plurality of semiconductor elements 1. Electrode structure 2 includes AC electrode 2A as the "first electrode" having semiconductor element 1 mounted on each of its surface, and DC electrodes 2B as the plurality of "second electrodes" holding therebetween the AC electrode 2A and the plurality of semiconductor elements 1A to 1D mounted on opposite surfaces of AC electrode 2A, and AC electrode 2A and DC electrode 2B have cooling medium channels 20A and 20B therein, respectively.

The embodiments as have been described here are mere examples and should not be interpreted as restrictive. The scope of the present invention is determined by each of the claims with appropriate consideration of the written description of the embodiments and embraces modifications within the meaning of, and equivalent to, the languages in the claims.

Industrial Applicability

The present invention is applicable, for example, to a structure for cooling a semiconductor element mounted on an electrode having a cooling medium channel.

The invention claimed is:

1. A semiconductor element cooling structure, comprising:
a plurality of semiconductor elements;
an electrode portion having a plurality cooling medium channels therein and electrically connected to said plurality of semiconductor elements; and
a protruding portion protruded from a wall surface of a cooling medium channel to the inside of said cooling medium channel, for directing flow of cooling medium flowing through said cooling medium channel to a semiconductor element, wherein
said electrode portion includes a first electrode having said semiconductor elements mounted on each of opposite surfaces, and a plurality of second electrodes holding therebetween said first electrode and said semiconductor elements mounted directly on each of the opposite surfaces of said first electrode;
said first electrode has a cooling medium channel therein and each of said plurality of second electrodes has a cooling medium channel therein; and
said protruded portion is provided to be positioned near a semiconductor element, from among said semiconductor elements, and upstream from a center of said semiconductor element in the flow direction of said cooling medium.

2. The semiconductor element cooling structure according to claim 1, having a structure formed by stacking a plurality of said electrode portions including said first and second electrodes.

3. The semiconductor element cooling structure according to claim 1, wherein
a plurality of said electrode portions including said first and second electrodes are arranged side by side.

4. The semiconductor element cooling structure according to claim 1, wherein
said semiconductor elements are included in a controller controlling a rotating electric machine driving a vehicle.

5. The semiconductor element cooling structure according to claim 3, wherein cooling medium in said plurality of cooling medium channels flows from a direction in which said plurality of said electrode portions are arranged side by side, flows through said plurality of said electrode portions, and flows out in the direction in which said plurality of said electrode portions are arranged side by side.

* * * * *